United States Patent
Then et al.

(10) Patent No.: US 11,195,944 B2
(45) Date of Patent: Dec. 7, 2021

(54) GALLIUM NITRIDE (GAN) TRANSISTOR STRUCTURES ON A SUBSTRATE

(71) Applicant: INTEL CORPORATION, Santa Clara, CA (US)

(72) Inventors: Han Wui Then, Portland, OR (US); Sansaptak Dasgupta, Hillsboro, OR (US); Sanaz K. Gardner, Portland, OR (US); Marko Radosavljevic, Beaverton, OR (US); Seung Hoon Sung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 15/576,508

(22) PCT Filed: Jun. 26, 2015

(86) PCT No.: PCT/US2015/037987
§ 371 (c)(1),
(2) Date: Nov. 22, 2017

(87) PCT Pub. No.: WO2016/209263
PCT Pub. Date: Dec. 29, 2016

(65) Prior Publication Data
US 2018/0175184 A1  Jun. 21, 2018

(51) Int. Cl.
*H01L 29/778* (2006.01)
*H01L 29/20* (2006.01)
(Continued)

(52) U.S. Cl.
CPC .... *H01L 29/7786* (2013.01); *H01L 21/76248* (2013.01); *H01L 29/2003* (2013.01);
(Continued)

(58) Field of Classification Search
CPC .................................................. H01L 29/7783
(Continued)

(56) References Cited

U.S. PATENT DOCUMENTS

2005/0133816 A1* 6/2005 Fan ................... H01L 29/66462
257/190
2009/0079034 A1  3/2009 Wang
(Continued)

FOREIGN PATENT DOCUMENTS

CN  103943498 A  7/2014
EP  2519968 A2  11/2012
(Continued)

OTHER PUBLICATIONS

International Search Report and Written Opinion received for PCT/US2015/037987, dated Mar. 28, 2016, 13 pages.
(Continued)

*Primary Examiner* — Robert T Huber
*Assistant Examiner* — Laura M Dykes
(74) *Attorney, Agent, or Firm* — Schwabe, Williamson & Wyatt, P.C.

(57) ABSTRACT

Techniques are disclosed for gallium nitride (GaN) oxide isolation and formation of GaN transistor structures on a substrate. In some cases, the GaN transistor structures can be used for system-on-chip integration of high-voltage GaN front-end radio frequency (RF) switches on a bulk silicon substrate. The techniques can include, for example, forming multiple fins in a substrate, depositing the GaN layer on the fins, oxidizing at least a portion of each fin in a gap below the GaN layer, and forming one or more transistors on and/or from the GaN layer. In some cases, the GaN layer is a plurality of GaN islands, each island corresponding to a given fin. The techniques can be used to form various non-planar isolated GaN transistor architectures having a relatively small form factor, low on-state resistance, and low off-state leakage, in some cases.

19 Claims, 9 Drawing Sheets

(51) Int. Cl.
  *H01L 29/78* (2006.01)
  *H01L 21/762* (2006.01)
  *H01L 29/786* (2006.01)
  *H01L 29/66* (2006.01)
  *H01L 29/423* (2006.01)
  *H01L 29/775* (2006.01)

(52) U.S. Cl.
  CPC .. *H01L 29/42392* (2013.01); *H01L 29/66742* (2013.01); *H01L 29/7783* (2013.01); *H01L 29/78* (2013.01); *H01L 29/785* (2013.01); *H01L 29/78681* (2013.01); *H01L 29/775* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2009/0278196 A1* | 11/2009 | Chang | H01L 21/823412 257/328 |
| 2013/0302953 A1 | 11/2013 | Kim et al. | |
| 2014/0110717 A1 | 4/2014 | Wenxu et al. | |
| 2014/0131735 A1* | 5/2014 | Hoentschel | H01L 29/66545 257/77 |
| 2015/0171205 A1 | 6/2015 | Then et al. | |
| 2015/0228780 A1* | 8/2015 | Cheng | H01L 29/785 257/401 |

FOREIGN PATENT DOCUMENTS

| | | |
|---|---|---|
| EP | 2575181 A2 | 4/2013 |
| KR | 20120010512 A | 2/2012 |
| TW | 201436222 A | 9/2014 |
| WO | 2011090577 A2 | 7/2011 |
| WO | 2013157875 A1 | 10/2013 |
| WO | 2014093555 A1 | 6/2014 |
| WO | 2016209263 A1 | 12/2016 |

OTHER PUBLICATIONS

International Preliminary Report on Patentability received for PCT/US2015/037987, dated Jan. 4, 2018, 10 pages.
Extended European Search Report received for EP Application No. 15896549.1, dated Feb. 18, 2019. 9 pages.
Park, et al., "Electron gas dimensionality engineering in AlGaN/GaN high electron mobility transistors using polarization," Applied Physics Letters, AIP Publishing LLS, vol. 100, No. 6, Feb. 6, 2012. 3 pages.
Office Action from Korean Patent Application No. 10-2018-7002271, dated Jul. 28, 2021, 8 pgs.

* cited by examiner

FIG. 2C"

GALLIUM NITRIDE (GAN) TRANSISTOR STRUCTURES ON A SUBSTRATE

CROSS-REFERENCE TO RELATED APPLICATIONS

This application is a U.S. National Phase Application under 35 U.S.C. § 371 of International Application No. PCT/US2015/037987, filed on Jun. 26, 2015, the entire contents of which is hereby incorporated by reference herein.

BACKGROUND

Radio frequency (RF) switches are important components found in the RF front-end system of modern mobile communication devices. The RF front-end today is required to support multiple wireless services at different frequency bands, such as long-range wireless bands (e.g., WiFi protocol), short-range wireless bands (e.g., Bluetooth protocol), and cellular bands (e.g., 3G/4G/LTE/GSM protocols). While some devices include multiple RF power amplifiers (e.g., more than 6) that are used specifically for different bands, there is typically room for no more than 3 antennae. Moreover, RF switches are required to enable functionalities such as the ability to download data simultaneously while the primary antenna is occupied for voice communication. There may be as many as twenty to thirty RF switches in a typical RF front-end. In addition, RF switches must be able to handle, in their off-states, up to 50V across drain and source while maintaining as low a leakage as possible. In their on-states, RF switches must provide as low of an on-resistance as possible to reduce power dissipation.

BRIEF DESCRIPTION OF THE DRAWINGS

FIG. 2F' illustrates a cross-section through a channel region of a finned non-planar multiple-quantum well (MQW) gallium nitride (GaN) transistor structure, in accordance with an embodiment of the present disclosure.

FIG. 2F" illustrates a cross-section through a channel region of a finned non-planar three-dimensional electron gas (3DEG) GaN transistor structure, in accordance with an embodiment of the present disclosure.

DETAILED DESCRIPTION

Figure 1:
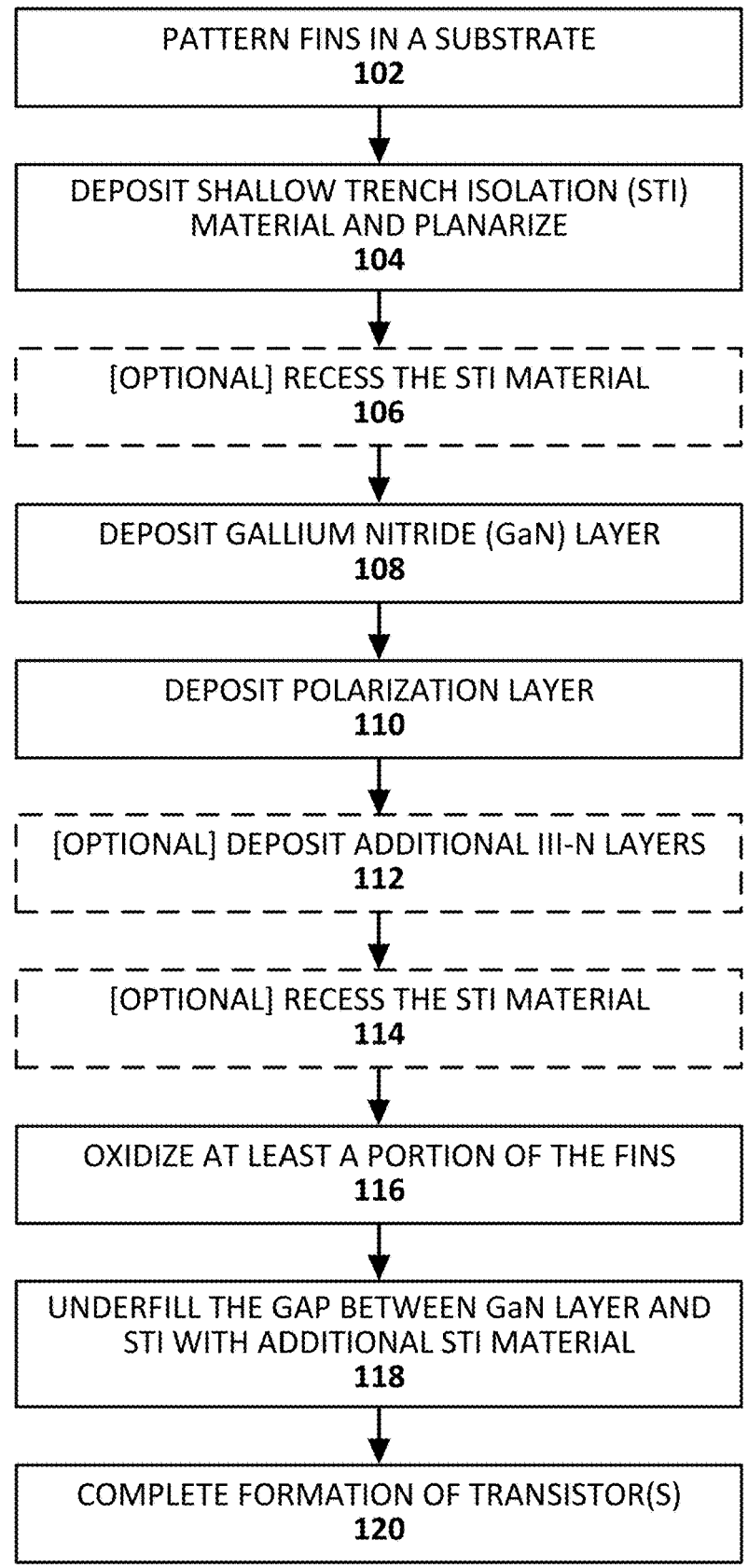
FIG. 1 illustrates a method of forming an integrated circuit, in accordance with various embodiments of the present disclosure.

Techniques are disclosed for gallium nitride (GaN) oxide isolation and formation of GaN transistor structures on a substrate (e.g., a bulk silicon (Si) substrate). The GaN transistor structures can be used, for example, for system-on-chip (SoC) integration of high-voltage GaN front-end radio frequency (RF) switches on a Si substrate. In an embodiment, the techniques can include forming multiple fins in a substrate, depositing the GaN layer on the fins, oxidizing at least a portion of each fin in a gap below the GaN layer, and forming one or more transistors on and/or from the GaN layer. For example, the GaN layer may be used for a transistor channel, but the transistor source and drain regions may be epitaxially regrown on the GaN layer. The techniques can be used, for example, in a process for forming low-leakage, high-breakdown, enhancement mode, high-k dielectric GaN transistors on isolated GaN islands. The techniques can also be used, for example, to form GaN transistors including multiple quantum-well (MQW) or three-dimensional electron gas (3DEG) architecture having reduced on-state resistance. The techniques can also be used to form finned (or tri-gate) and nanowire (or gate-all-around) architecture to, for example, achieve low off-state leakage. Numerous variations and configurations will be apparent in light of this disclosure.

General Overview

Radio frequency (RF) switches are predominantly implemented using a gallium arsenide (GaAs) pseudomorphic high-electron-mobility transistor (pHEMT) on semi-insulating GaAs substrates. Note that HEMT (or pHEMT) may also be referred to as a heterostructure field-effect transistor (HFET), modulation-doped FET (MODFET), two-dimensional electron gas FET (TEGFET), or selectively-doped heterostructure transistor (SDHT); however, the devices will primarily be referred to as HEMT herein for ease of description. GaAs pHEMTs present non-trivial issues such as difficulty with simultaneously achieving the low on-resistance and the small form factor (die sizes) required for system-on-chip (SoC) applications. In addition, GaAs pHEMTs are typically formed as depletion-mode (D-mode) devices, requiring negative supply voltages to turn them off and thereby leading to increased circuit complexity and system cost. Further, the relatively low bandgap of GaAs (bandgap of 1.4 eV) limits the abilities of GaAs pHEMTs with respect to, for example, scalability, on-state resistance, off-state leakage, RF loss, control logic integration, applied voltage capabilities, and power dissipation. Accordingly, gallium nitride (GaN), a higher bandgap material (bandgap of 3.4 eV) has been considered as a replacement for GaAs in HEMT devices. However, such GaN transistors are predominantly D-mode HEMT devices implemented on relatively expensive silicon carbide (SiC) wafers having a relatively small diameter (e.g., 3-4 inches). Therefore, the cost of such GaN transistors is accordingly higher, making the devices impractical for many applications.

Thus, and in accordance with one or more embodiments of the present disclosure, techniques are disclosed for GaN oxide isolation and formation of GaN transistor structures on a silicon (Si) substrate. As will be apparent in light of this disclosure, the oxide isolation techniques enable formation of GaN transistor structures on Si substrates and also enable the low-leakage required at high applied voltage ($V_{DD}$) for HEMT devices. Accordingly, the techniques can be used, for example, for system-on-chip (SoC) integration of high-voltage GaN front-end RF switches on a Si substrate, in accordance with an embodiment. As previously described, GaN is a higher bandgap material (bandgap of 3.4 eV) compared to, for example, GaAs (bandgap of 1.4 eV), and therefore, GaN provides numerous benefits in the context of transistor performance, as described herein. In some embodiments, the techniques can be used to form GaN transistor structures on a silicon germanium (SiGe) or germanium (Ge) substrate. In some embodiments, the techniques can be used to form GaN transistor architecture including, but not limited to, HEMT, pHEMT, transistors employing two-dimensional electron gas (2DEG) architecture, transistors employing three-dimensional electron gas (3DEG) or 3D polarization field-effect transistor (FET) architecture, and transistors employing multiple quantum-wells (MQW) or super-lattice architecture.

In some embodiments, the techniques include forming nanotemplates in a substrate (e.g., a bulk Si substrate) by patterning the substrate and etching fins (e.g., via shallow trench recess (STR) etch). A shallow trench isolation (STI) material (e.g., oxide or nitride material) can then be deposited in the STR trenches to, for example, isolate the substrate fins from each other. A layer of GaN can then be deposited on the structure, and in some embodiments, a nucleation layer (e.g., aluminum nitride) may be deposited prior to depositing the GaN layer (e.g., to prevent GaN from reacting with the substrate material). Note that the GaN layer (and the nucleation layer, where present) may be deposited such that they only grow on the substrate fins (e.g., using a metal-organic chemical vapor deposition (MOCVD) process). A gap may exist between the GaN layer and the STI material, and in some embodiments, the STI material under the GaN layer may be optionally etched away to form the gap or increase the gap size, thereby exposing at least a portion of the substrate fins. Note that in some embodiments, the STI material may be recessed prior to depositing the GaN layer, such that the gap exists after the GaN layer is formed. The exposed portion of the substrate fins in the gap can then be oxidized to isolate the GaN layer from the substrate. The gap between the GaN layer and STI material can then be filled in (e.g., using a spin-on deposition process) with additional STI material. The resulting isolated GaN layer (whether a single continuous GaN layer across the fin tops or a plurality of GaN layers or so-called GaN islands each corresponding to a particular fin top, as the case may be) can be used to form various transistor devices on and/or from the layer. In this manner, the GaN layer acts as a pseudo-substrate, electrically isolated from the subjacent substrate (e.g., the Si, SiGe, or Ge substrate), upon which transistor structures can be formed. For example, in some embodiments, n-channel transistor devices can be formed by epitaxial regrowth of n-type source and drain (S/D) regions. As will be apparent in light of the present disclosure, such transistor devices may include the following geometry: HEMT architecture, MQW or super-lattice architecture, 3DEG architecture, finned (e.g., tri-gate or FinFET) configuration, and/or nanowire (or nanoribbon or gate-all-around) configuration, just to provide some example device geometries.

In some embodiments, advantages can be achieved as a result of using isolated GaN for the transistor structures variously described herein. As previously described, GaN has a wide bandgap of 3.4 eV (e.g., compared to the 1.4 eV bandgap of GaAs), therefore allowing GaN transistors to withstand larger electric fields (applied voltage, $V_{DD}$) before suffering breakdown. For example, the electric field that GaN transistors can withstand may be magnitudes larger than what a GaAs transistor of similar dimensions can withstand before suffering breakdown. This also enables GaN transistors to be scaled down to even smaller physical dimensions while operating at the same $V_{DD}$, thereby enabling smaller on-resistance, smaller capacitance, and smaller transistor widths, resulting in benefits such as reduced power dissipation, higher circuit efficiencies, and smaller form factor. Moreover, GaN has a high electron mobility (e.g., approximately 1000 square cm/(V-s)). GaN n-channel transistors can also employ 2DEG, which may be located at the abrupt hetero-interface formed by epitaxial deposition of a charge-inducing film with larger spontaneous and piezoelectric polarization (referred to herein as a polarization layer). Such polarization layer materials may include aluminum nitride (AlN), aluminum gallium nitride (AlGaN), indium aluminum nitride (InAlN), indium aluminum gallium nitride (InAlGaN), or any other suitable material, depending on the end use or target application. Accordingly, very high charge densities (e.g., up to 2E13 per square cm) can be formed by such a mechanism without impurity dopants, allowing high mobilities to be preserved.

Numerous other benefits of the techniques and structures variously described herein will be apparent in light of this disclosure. For example, the techniques can be used to achieve large-scale SoC integration by integrating GaN on large Si substrates (e.g., 8 inches/20 cm and larger). Further, the oxide isolation techniques enable the low-leakage required at high $V_{DD}$ commonly used in SoC implementations. In addition, the techniques and structures can improve the on-resistance by utilizing multiple quantum-wells and 3DEG architecture, as well as non-planar/3D configurations (e.g., finned or tri-gate architecture, nanowire or nanoribbon or gate-all-around architecture, etc.), therefore reducing the transistor widths required and thereby enabling smaller form factor. Another benefit of the techniques is that they can be used to achieve enhancement mode GaN transistors, thereby removing the need for bias circuits that supply the negative gate voltage, and thus, enabling smaller form factor and saving on costs associated with the componentry and processing related to depletion-mode (D-mode) transistor structures. Further yet, GaN is of particular utility for the techniques variously described herein, because GaN will not be oxidized during the oxidation process, as compared to other III-V materials that would decompose under the oxidation conditions. Further still, GaN can achieve high-electron mobility (e.g., approximately 1000 square cm/($V_{-s}$)) that is required for HEMT device applications. In addition, GaN delivers improved figure-of-merit (FOM) performance compared to, for example, existing Si metal-oxide-semiconductor field-effect transistors (MOSFETs).

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the integrated circuit and transistor structures variously described herein. For example, in some embodiments, GaN transistors formed on fins of a Si, SiGe, or Ge substrate may be detected. Further, the GaN layer from which transistors are formed in and/or on (e.g., a transistor channel region may be formed in the GaN layer, but source and drain regions may be formed on the layer via epitaxial regrowth) may be electrically isolated from the substrate, due to at least a portion of the substrate fins being oxidized. For example, in the case of a Si substrate, at least a portion of each fin may be oxidized to silicon dioxide, thereby electrically isolating the upper GaN layer from the underlying Si substrate and reducing or preventing leakage from the GaN transistors to the Si substrate. Accordingly, the techniques allow SoC integration, where GaN transistors can be formed on Si substrates. In some embodiments, the GaN transistor structures may be included in one or more RF switches, such as high-voltage front-end RF switches. The GaN transistor structures variously described herein may be suitable for various applications, such as the personal computing (PC), tablet computer, smartphone, power management, and communication applications, as well as power conversion and automotive applications; however, the present disclosure is not intended to be so limited. For example, as customers are demanding smaller form factor to accommodate more integrated circuits for more functionalities, there is high demand for efficient and small form factor RF front-end, and therefore, isolated GaN transistor-based SoC solutions are very attractive. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-F illustrate example integrated circuit structures that are formed when carrying out method 100 of FIG. 1, in accordance with various embodiments. As will be apparent in light of the structures formed, method 100 discloses techniques for GaN oxide isolation for the purposes of forming GaN transistor structures on a substrate. Various transistor geometries can benefit from the techniques described herein, including, but not limited to, HEMT, pHEMT, transistors employing 2DEG architecture, transistors employing 3DEG (or 3D polarization FET) architecture, transistors employing multiple quantum-wells (MQW) or super-lattice architecture. In addition, the techniques may be used to form CMOS transistors/devices/circuits, where the GaN transistor structures variously described herein are used for the n-MOS transistors of the CMOS, for example.

Figure 2A:
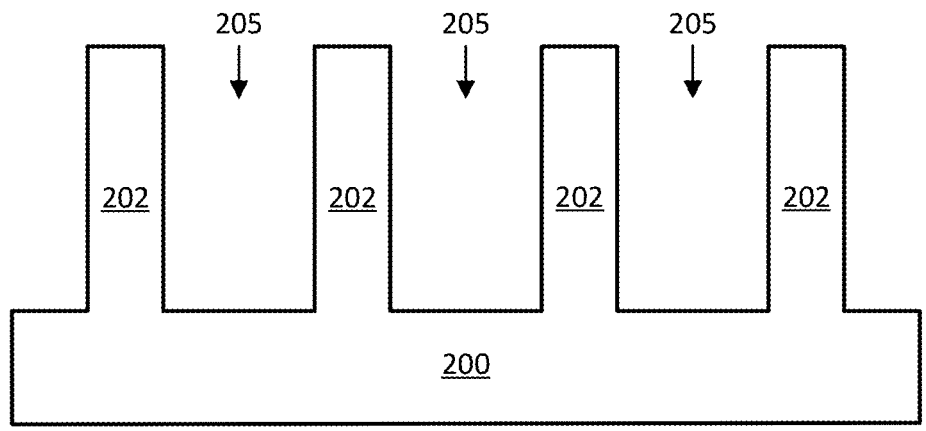
FIGS. 2A-F illustrate example structures that are formed when carrying out the method of FIG. 1, in accordance with various embodiments of the present disclosure.

As can be seen in FIG. 1, method 100 includes forming 102 fins 202 in a substrate 200 to form the example resulting structure shown in FIG. 2A, in accordance with an embodiment. In some embodiments, substrate 200 may be a bulk substrate of Si, SiGe, or Ge. In some embodiments, substrate 200 may be an X on insulator (XOI) structure where X comprises Si, SiGe, or Ge, and the insulator material is an oxide material or dielectric material or some other electrically insulating material or some other suitable multilayer structure where the top layer comprises Si, SiGe, or Ge. For example, in some embodiments, the substrate may be a bulk Si substrate with a buffer layer of SiGe or Ge on top of a portion of the bulk Si substrate, where that buffer layer can be used for substrate 200 as variously described herein. The bulk Si substrate may be of high resistivity (e.g., greater than 10 ohm-cm), in some example applications. Fins 202 can be formed 102 from substrate 200 using any suitable techniques, such as using one or more patterning, masking, lithography, and etching (wet and/or dry) processes. As can also be seen in FIG. 2A, the structure includes trenches 205, which may be referred to as shallow trench recess (STR) trenches, in some instances. Trenches 205 may be formed with varying widths and depths, and fins 202 may be formed to have varying widths and heights, depending on the end use or target application. Fins 202 may be formed to have varying widths and heights. Note that the trenches 205 and fins 202 are each shown as having the same width and depth/height in this example structure for ease of illustration; however, the present disclosure is not intended to be so limited. Further note that although four fins 202 are shown in the example structure, any number of fins may be formed, such as one, two, ten, hundreds, thousands, millions, etc., depending on the end use or target application.

Figure 2B:
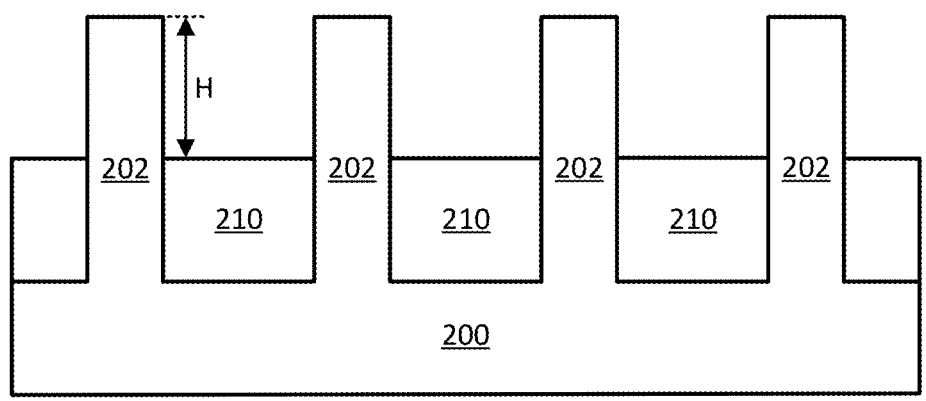

Method 100 of FIG. 1 continues with depositing 104 shallow trench isolation (STI) material 210 and planarizing to form the resulting example structure shown in FIG. 2B, in accordance with an embodiment. Deposition 104 of STI material 210 may include any suitable techniques, such as chemical vapor deposition (CVD), atomic layer deposition (ALD), physical vapor deposition (PVD), or any other suitable deposition process. STI material 210 may comprise any suitable insulating material, such as one or more oxides (e.g. silicon dioxide) and/or nitrides (e.g., silicon nitride). In some embodiments, the STI material 210 may selected based on the substrate material 200. For example, in the case of a Si substrate 200, STI material 210 may be silicon dioxide or silicon nitride. Note that in some cases, fins 202 may protrude from STI material 210 after the planarization process has been performed.

Method 100 of FIG. 1 continues with optionally recessing 106 the STI material 210, in accordance with an embodiment. For example, a recess 106 process may have been performed after the planarization of process 104 to cause fins 202 to increase the amount of fins 202 that protrude from STI material 210. Such a recess process 106 may include any suitable wet or dry etch processes, or any other suitable process. As can be seen in FIG. 2B, the fins protrude out such that height H of fins 202 is above the STI material, in this example embodiment.

Figure 2C:
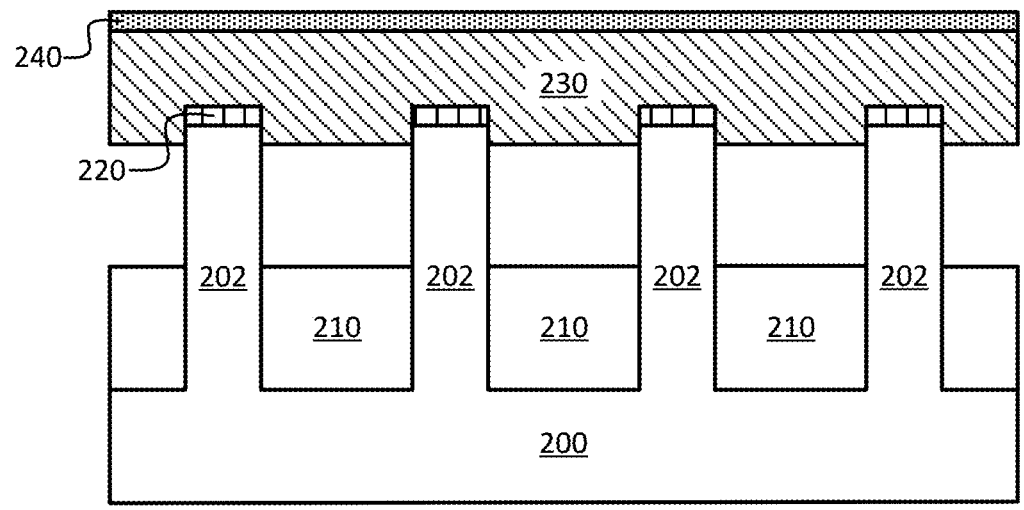
Figure 2C:
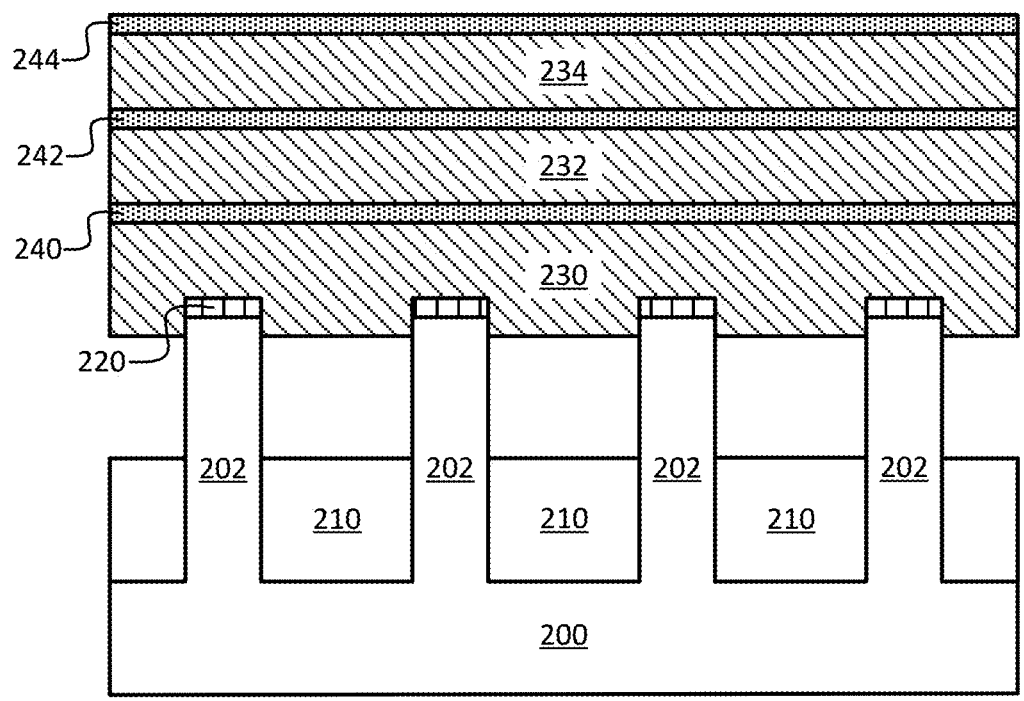

Method 100 of FIG. 1 continues with depositing 108 the GaN layer 230 and depositing 110 the polarization layer 240 to form the resulting example structure shown in FIG. 2C, in accordance with an embodiment. Depositions 108 and 110 may include any suitable techniques, such as growing the GaN layer 230 and the polarization layer 240 in a metal-organic chemical vapor deposition (MOCVD) chamber or any other suitable deposition process. In some embodiments, the growth conditions may be adjusted based on the desired resulting characteristics of the layers. For example, in some cases, the temperature may be increased and/or the pressure may be decreased and/or the VIII ratio (e.g., the ratio of N2 to Ga precursor gas flows) may be increased to cause the lateral component of the layers 230 and 240 to grow faster, thereby maintaining the layers 230 and 240 as thin as possible in the vertical component of the layer. In some embodiments, the GaN layer 230 may be deposited 108 such that it only grows on the substrate material (and thus only on the exposed substrate fins 202) and not on the STI material 210. In embodiments where the nucleation layer 220 is present (as described in more detail below), the GaN layer 230 may be grown on that nucleation layer and/or the substrate fins 202. Therefore, in some embodiments, the GaN material for layer 230 may be deposited such that it only grows on III-V materials and the substrate material (e.g., Si, SiGe, Ge), but does not grow on the STI material 210. For example, the structure of FIG. 2C was formed because the deposition process 108 used (e.g., MOCVD) resulted in the GaN material 230 only growing on fins 202. In some embodiments, the GaN layer 230 may be separate islands of GaN growth on each of the substrate fins 202. In such an embodiment, the GaN layer 230 shown in FIG. 2C would include multiple GaN islands across the top of each fin 202, but those islands would not be connected, for example. In some instances, the GaN layer 230 may be separated to form such GaN layer 230 islands. In some embodiments, the GaN layer 230 may be approximately 1 micron in thickness (e.g., approximately 1 micron high when deposited) or less, or any other suitable thickness depending on the end use or target application.

In some embodiments, the polarization layer may be aluminum nitride (AlN), aluminum gallium nitride (AlGaN), indium aluminum nitride (InAlN), indium aluminum gallium nitride (InAlGaN), or any other suitable material, as will be apparent in light of this disclosure. In some embodiments, the polarization layer 240 may be less than 50 nm in thickness, such as approximately 20-30 nm, or any other suitable thickness depending on the end use or target application. In some embodiments, a nucleation layer 220 may optionally be deposited on the structure of FIG. 2B prior to depositing 108 the GaN layer 230. The nucleation layer 220 may be deposited to prevent the GaN layer 230 from reacting with the substrate material (e.g., in the regions where the GaN layer 230 would otherwise be directly deposited on the substrate material fins 202). Deposition of the nucleation layer 220 may be performed using any suitable techniques, such as growing the nucleation layer 220 in an MOCVD chamber, for example. In some embodiments, the nucleation layer may be selectively deposited on fins 202, as the nucleation material may only grow on the substrate fin material 202 and not on the STI material 210. In some embodiments, the nucleation layer may be a III-V material, such as aluminum nitride (AlN) or a low temperature GaN layer (e.g., deposited at a temperature in the range of 700 to 950 degrees Celsius), for example. In some embodiments, where present, the nucleation layer 220 may have a thickness of less than 50 nm, such as approximately 20 nm, or any other suitable thickness depending on the end use or target application.

Method 100 of FIG. 1 optionally continues with depositing 112 additional III-N layers on the structure of FIG. 2C to form one of the resulting example structures of FIG. 2C' or 2C", in accordance with some embodiments. As will be apparent in light of this disclosure, the example structure of FIG. 2C' can be used to form MQW or super-lattice transistor structures, while the example structure of FIG. 2C" can be used to form a 3D polarization FET. Deposition 112 can be performed using any suitable techniques, such as growing the additional III-N material layers in an MOCVD chamber, for example. As shown in the example structure of FIG. 2C', two additional sets of 2DEG layers were deposited, where each set includes a GaN layer and a polarization layer. In other words, the first set of 2DEG layers includes GaN layer 232 and polarization layer 242, and the second set of 2DEG layers includes GaN layer 234 and polarization layer 244. Any number of additional 2DEG layer sets could be deposited in process 112 to form the multiple quantum-well structure, and although two sets are shown in this example embodiment, one set, five sets, 100 sets, 1000 sets, etc. could be formed. Further, polarization layers 242 and 244 may be any polarization layer material described herein (e.g., AlN, AlGaN, InAlN, InAlGaN) or any other suitable polarization layer material, depending on the end use or target application. Transistor structures formed from the example structure of FIG. 2C' will be described in more detail below. As shown in the example structure of FIG. 2C", two additional layers were formed in this alternative embodiment of depositing additional group III-N material layers. Layer 236 is a graded layer including GaN that was uniformly graded with increasing indium (In) up to a percentage of approximately 5-20% (or approximately 10%) In near the middle of the layer, and then uniformly graded with decreasing In content until 0% In is deposited (and thus just GaN is deposited). A polarization layer 246 can then be deposited on graded layer 236. In some instances, aluminum nitride (AlN) may be selected for polarization layer 246, as the resulting structures to be formed can be 3D polarization FET or 3DEG transistors, as will be described in more detail below. However, any polarization layer material described herein or any other suitable polarization layer material may be selected for layer 246, depending on the end use or target application.

Method 100 of FIG. 1 continues with optionally recessing 114 the STI material 210, in accordance with an embodiment. For example, depending upon the gap G between the GaN layer 230 and the STI material 210 shown in FIG. 2D, recess 114 may be performed to increase the gap distance G to, for example, provide a better opening for the oxidation process 116 described below. In some embodiments, optional recess 114 may be performed using a wet etch to etch under GaN layer 230. In some such embodiments, the etchant may be selective to the STI material 210, such that it either 1) removes the STI material 210 without etching away the substrate material 200/202 or the III-N material layers deposited above the STI material 210 (e.g., layers 230 and 240) or 2) etches away the STI material 210 at a faster rate than it etches away the substrate material 200/202 and/or the III-N material layers.

Figure 2D:
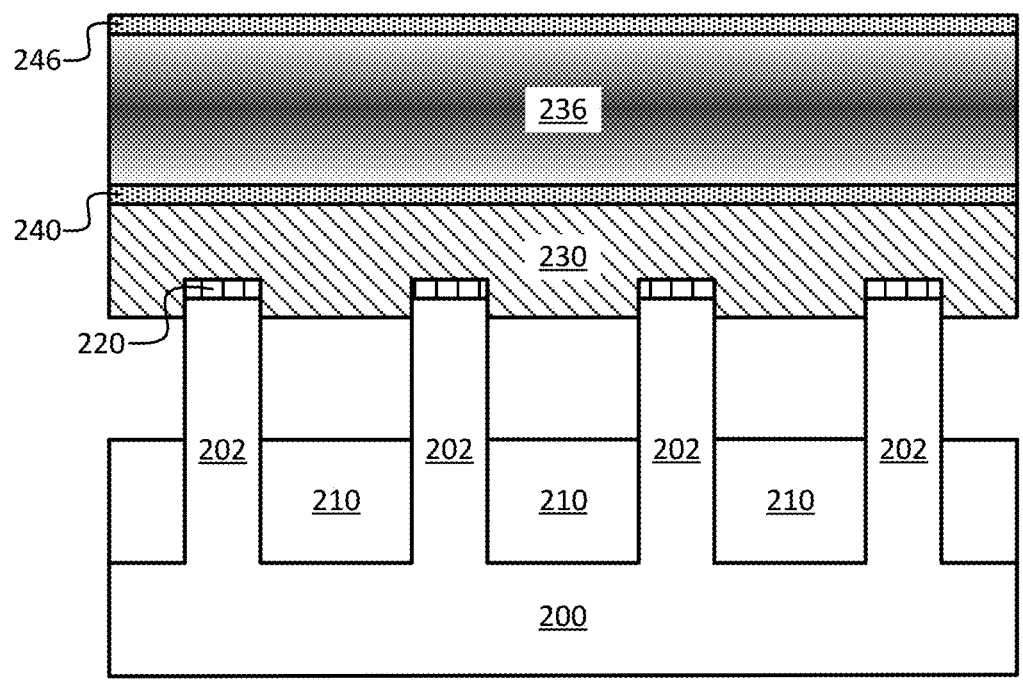
Figure 2D:
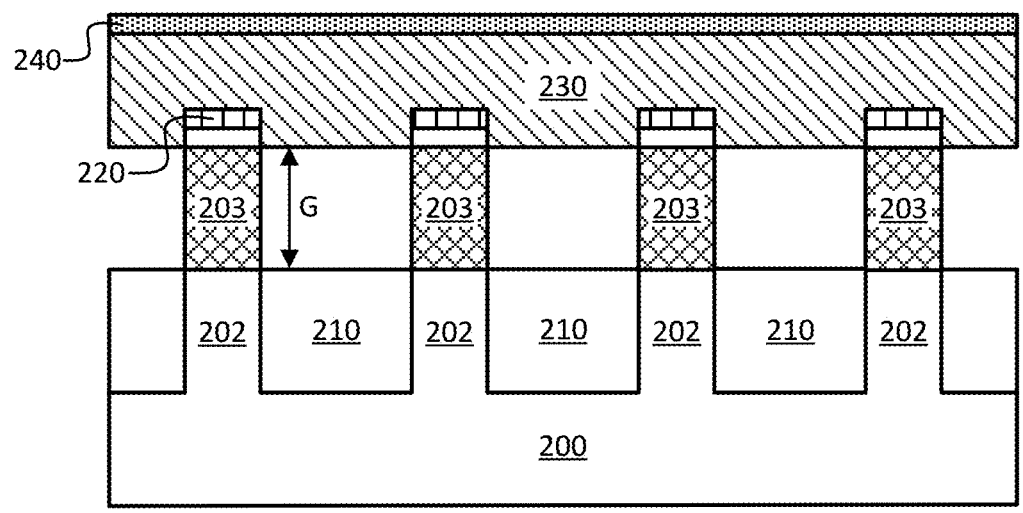

Method 100 of FIG. 1 continues with oxidizing 116 at least a portion of fins 202 to form the resulting example structure of FIG. 2D with oxidized fin portions 203, in accordance with an embodiment. Oxidation 116 which causes oxidized fin portions 203 results in GaN layer 230 being fully or nearly fully isolated from substrate 200, which reduces leakage that would otherwise occur without the isolation. Oxidation 116 can be performed using any suitable techniques, such as a wet or dry thermal oxidation process, or any other suitable oxidization process. For example, in embodiments where the substrate 200 is Si, oxidation 116 may be performed at a temperature of 800 to 1000 degrees Celsius using, for example, water vapor (usually ultra-high-purity steam) or molecular oxygen as the oxidant to form silicon dioxide. In some cases, oxidized fin portions 203 may be referred to as a high temperature oxide layers (HTOs). The oxidation conditions and oxidizing agent selected for oxidation process 116 may depend on the material of substrate 200 (and thus the material of native fins 202). For example, if substrate 200 is Ge or SiGe with up to 30% Ge, then the lower temperatures may be used during oxidation 116. GaN is of particular utility for the oxidation process 116, because GaN will not oxidize/decompose as readily or as quickly during the process 116, as compared to other III-V materials that would decompose under the oxidation conditions (e.g., as a result of the high temperatures used during oxidation process 116). As can be understood, the oxidation techniques 116 allow the GaN layer 230 to be used as a pseudo-substrate upon which one or more transistors can be formed, as the GaN layer 230 is electrically isolated from substrate 200 after oxidation 116 has been performed. Therefore, in some embodiments, GaN layer 230 may be described as a GaN pseudo-substrate 230 from which one or more GaN transistor structures can be formed, as will be apparent in light of this disclosure.

Figure 2E:
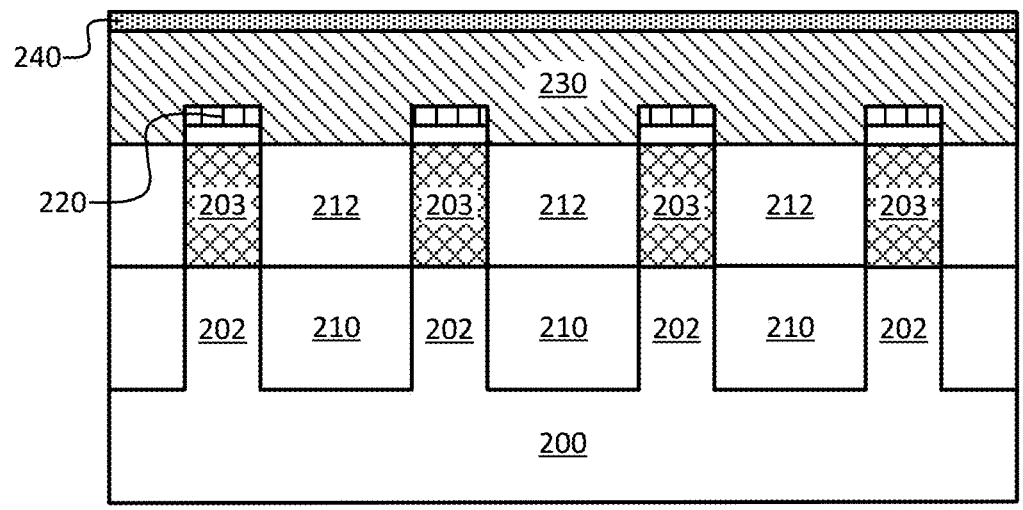

Method 100 of FIG. 1 continues with underfilling 118 the gap G between the GaN layer 230 and STI material 210 with additional STI material 212 to form the resulting example structure shown in FIG. 2E, in accordance with an embodiment. Underfilling 118 can be performed using any suitable technique, such as a spin-on process or other suitable process. In some cases, the STI material 212 may be reflowable, allowing it to be subjected to high temperatures (e.g., 500-600 degrees Celsius). STI material 212 may be any suitable material, such as any material described for STI layer 210 (such as an oxide and/or nitride material). In some embodiments, additional STI material 212 may be the same as STI material 210, while in other embodiments, additional STI material 212 may be different than STI material 210, depending on the end use or target application.

Figure 2F:
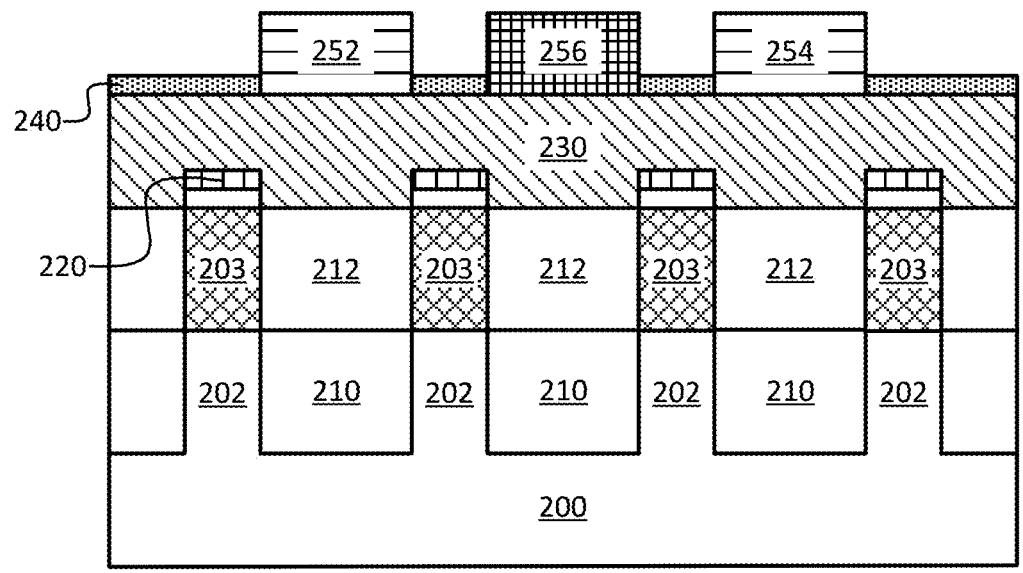
Figure 2F:
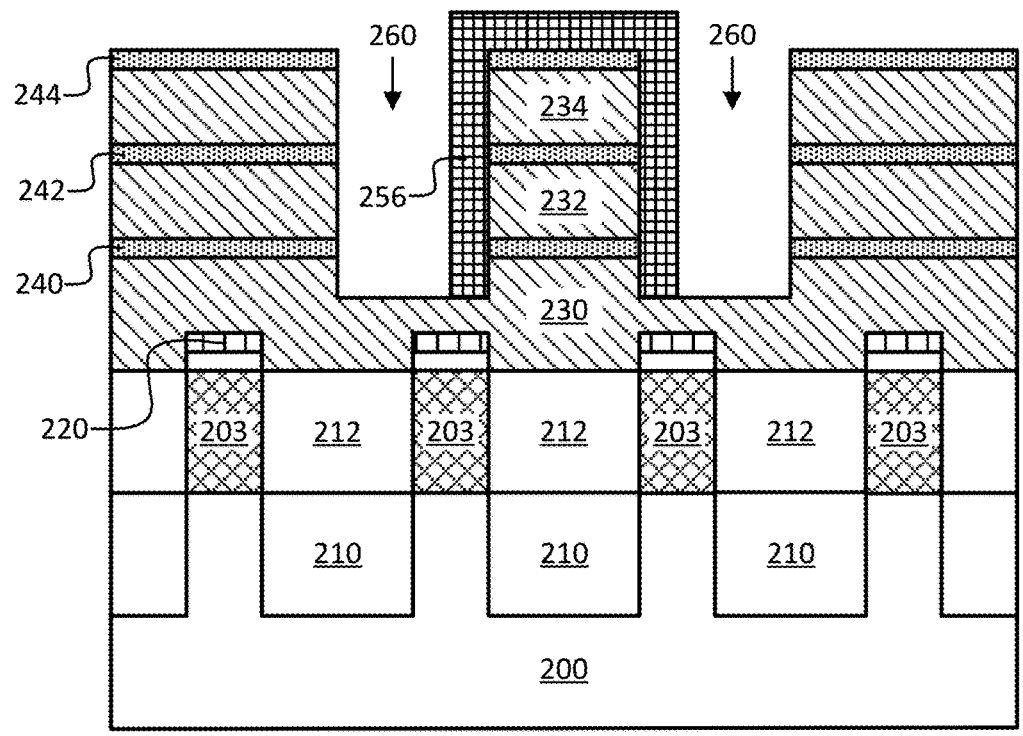
Figure 2F:
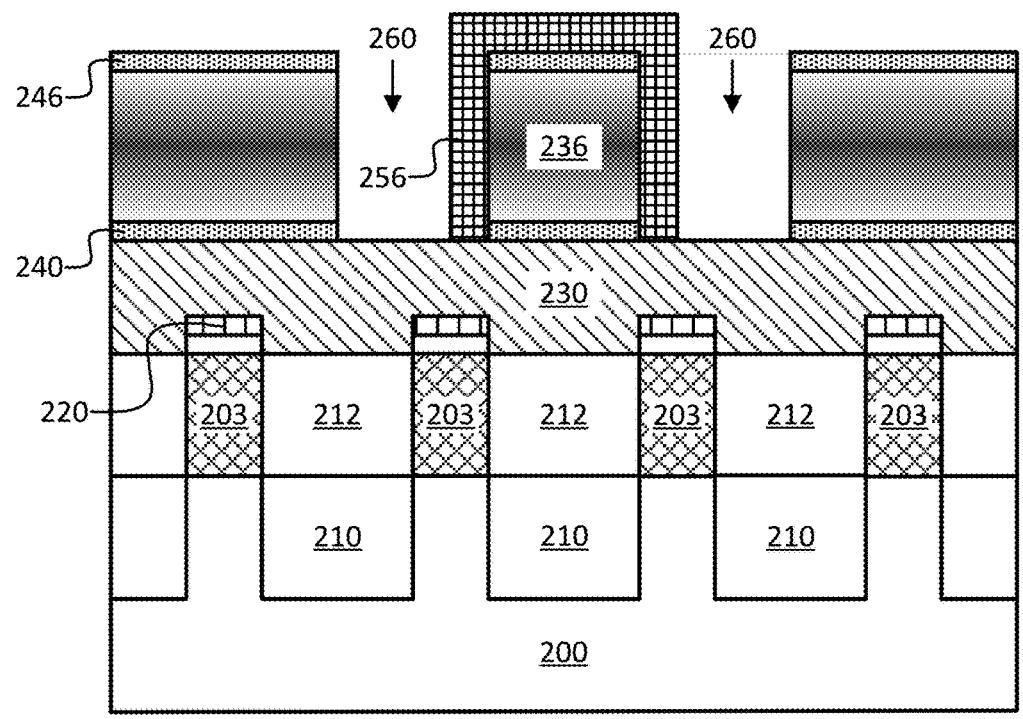

Method 100 of FIG. 1 continues with completing 120 the formation of one or more transistors on the isolated GaN layer 230, in accordance with various embodiments. Various different processes can be performed to complete 120 the formation of one or more transistors, including transistors having various geometries, such as HEMT architecture, MQW or super-lattice architecture (discussed below with respect to FIG. 2F'), 3DEG architecture (discussed below with respect to FIG. 2F"), finned (e.g., tri-gate or FinFET) configuration, and/or nanowire (or nanoribbon or gate-all-around) configuration. For example, FIG. 2F illustrates a transistor formed on the isolated GaN layer, where the transistor includes source and drain (S/D) 252, 254 and gate 256 (formed over the channel region in GaN layer 230). In this example embodiment, S/D regions 252 and 254 can be formed by masking the structure of FIG. 2E and etching to remove polarization layer 240 in the S/D regions 252 and 254, followed by epitaxial regrowth of n-type S/D material. For example, the material may be indium gallium nitride (InGaN) doped with Si to form n-type S/D regions 252 and 254. In some embodiments, the S/D material may be n-type doped gallium nitride, n-type doped indium gallium nitride with a graded indium composition, or any other suitable material as will be apparent in light of the present disclosure. After the S/D regions 252 and 254 are formed, the gate stack 256 can be formed by etching the polarization layer 240 from the channel region (the region under gate 256) and forming the gate stack 256 as variously described below. In this example embodiment, enhancement mode operation of the transistor is achieved by removing the polarization layer 240 below the gate 256. As is known, enhancement mode includes that the transistor is normally off and will not conduct when there is no electrical potential difference between the gate and the source. This can be compared to depletion mode (or D-mode) transistor configurations, which would be the resulting configuration if the polarization layer was not removed prior to forming gate stack 256. However, enhancement mode operation is more desirable, in some cases, due to the benefits obtained from such a mode (some of which are described herein).

In some embodiments, the formation of gate stack 265 may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate (RMG) process. Following opening the channel region, the dummy gate oxide and electrode may be replaced with, for example, a gate dielectric and a replacement metal gate, respectively. Other embodiments may include a standard gate stack formed by any suitable process, such as a subtractive process where the gate dielectric/gate metal is deposited and then followed by one or more etching processes. Any number of standard back-end processes may also be performed to help complete 120 the formation of one or more transistors.

In the example structure shown in FIG. 2F, the gate stack 256 may include a gate electrode and a gate dielectric formed directly under the gate electrode. The gate dielectric and gate electrode may be formed using any suitable technique and from any suitable materials. For example, the gate stack may have been formed during a replacement metal gate process, as previously described, and such a process may include any suitable deposition technique (e.g., CVD, PVD, etc.). The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. Further, the gate electrode may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Various back end processes can also be performed, such as forming contacts on the S/D regions 252 and 254 using, for example, a silicidation process (generally, deposition of contact metal and subsequent annealing).

FIG. 2F' illustrates a cross-section through a channel region of a finned non-planar multiple-quantum well (MQW) GaN transistor structure, in accordance with an embodiment of the present disclosure. The transistor structure in this example embodiment continues from the structure of FIG. 2C', where multiple 2DEG layer sets were formed (e.g., GaN layer 232/polarization layer 242 and GaN layer 234/polarization layer 244). From FIG. 2C', the structure was oxidized 116 and underfilled 118 as variously described above. Then, completion 120 of the formation of the transistor structure included etching and patterning the III-N layers (e.g., the GaN layers and polarization layers) into fins, forming trenches 260. In some embodiments, the fins can be formed with widths of less than 100 nm and heights greater than 20 nm, for example. Process 120 in this example embodiment may have then continued by forming the source/drain region, which may have included deposition of n-type InGaN in those regions, for example, or some other suitable techniques for the source/drain processing. Process 120 in this example embodiment may have then continued by forming gate stack 256, as variously described herein. Therefore, method 100 can be used to form MQW or super-lattice transistor structures on Si, SiGe, or Ge substrates, using the oxide isolation techniques described herein. Recall that any number of sets of 2DEG layers may have been formed during process 112 (the deposition of additional III-N layers). Therefore, the MQW channel region shown in FIG. 2F' may include more or less 2DEG (GaN/polarization layer) sets, depending on the end use or target application. Note that although trenches 260 are recessed into the first/lowermost GaN layer 230, the present disclosure is not intended to be so limited. In some cases, the trenches 260 used to form the 3DEG fin structures may be shallower or deeper, depending on the end use or target application. In some embodiments, the polarization layers of the MQW structures can be used to reduce on-resistance of the GaN transistor. Numerous other configurations and benefits of the MQW or super-lattice GaN transistor structures will be apparent in light of the present disclosure.

FIG. 2F" illustrates a cross-section through a channel region of a finned non-planar 3DEG GaN transistor structure, in accordance with an embodiment of the present disclosure. The transistor structure in this example embodiment continues from the structure of FIG. 2C", where a graded 3D polarization layer 236 was formed. From FIG. 2C''', the structure was oxidized 116 and underfilled 118 as variously described above. Then, completion 120 of the formation of the transistor structure included etching and patterning the III-N layers (e.g., the GaN layers and polarization layers) into fins, forming trenches 260. In some embodiments, the fins can be formed with widths of less than 100 nm and heights greater than 20 nm, for example. Process 120 in this example embodiment may have then continued by forming the source/drain region, which may have included deposition of n-type InGaN in those regions, for example, or some other suitable techniques for the source/drain processing. Process 120 in this example embodiment may have then continued by forming gate stack 256, as variously described herein. Therefore, method 100 can be used to form 3DEG or 3D polarization FET transistor structures on Si, SiGe, or Ge substrates, using the oxide isolation techniques described herein. Note that although trenches 260 are not recessed into the first/lowermost GaN layer 230, the present disclosure is not intended to be so limited. In some cases, the trenches 260 used to form the 3DEG fin structures may be shallower or deeper, depending on the end use or target application. In some embodiments, the polarization layers of the 3DEG structures can be used to reduce on-resistance of the GaN transistor. Numerous other configurations and benefits of the 3DEG or 3D polarization FET transistor structures will be apparent in light of the present disclosure.

Figure 3:
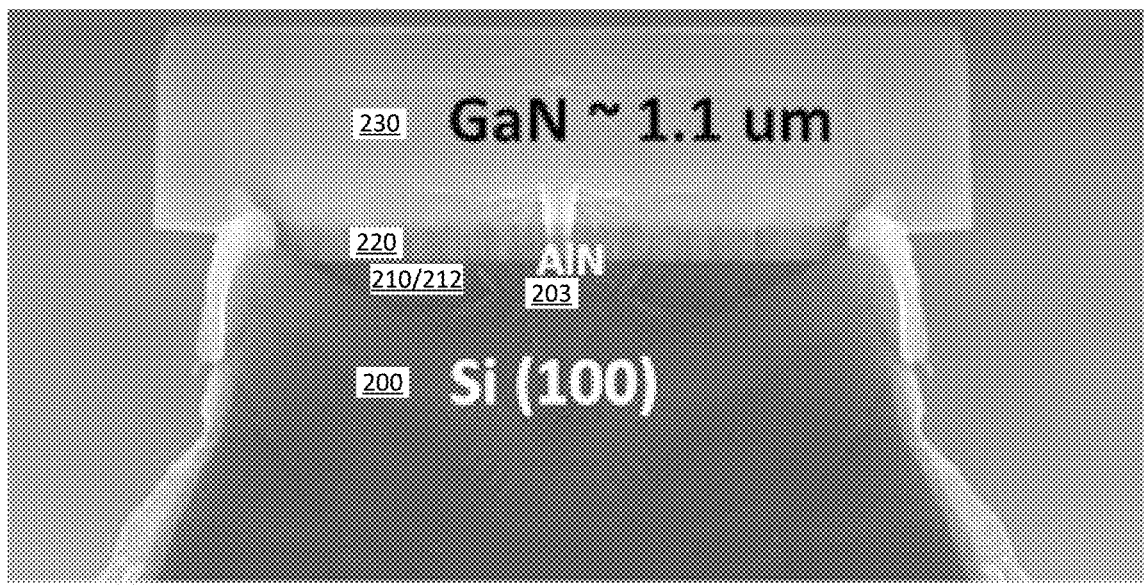
FIG. 3 is a transmission electron microscopy (TEM) image illustrating a cross-sectional side view of an integrated circuit structure formed in accordance with an embodiment of the present disclosure.

FIG. 3 is a transmission electron microscopy (TEM) image illustrating a cross-sectional side view of an integrated circuit structure formed in accordance with an embodiment of the present disclosure. As can be seen, the image illustrates a Si substrate 200 including an oxidized fin 203 surrounded by STI material 210/212. As can also be seen, AlN nucleation layer 220 is formed on the substrate 200 and STI material 210/212 and GaN layer 230 was formed on and over the nucleation layer and substrate 200. Note that the GaN layer 230 in this example embodiment has a thickness of approximately 1.1 microns, although other suitable thicknesses can be used as well (e.g., 0.25 microns to 2.5 microns). An oxidation process 116 may then be used in this example embodiment to isolate the GaN layer 230 from the Si substrate 200, to allow for electrically isolated GaN transistor structures to be formed on GaN layer 230 and prevent or reduce leakage from the GaN layer to the Si substrate 200. In some embodiments, the techniques can be used to form GaN transistors with off-state leakage currents of less than 1E-4 mA per micron up to approximately 40V, for example. Accordingly, the techniques enable SoC integration of GaN transistors on a Si substrate (or SiGe substrate or Ge substrate), as variously described herein.

In some embodiments, the GaN transistor structures variously described herein (e.g., the MQW and 3DEG transistor structures) can be formed with a non-planar configuration, such as a finned (e.g., tri-gate or FinFET) or nanowire (or nanoribbon or gate-all-around) configuration. In finned transistor configurations, there are three effective gates—two on either side and one on top—as is known in the field. Nanowire transistor configurations are configured similarly to fin-based transistor configurations, but instead of a finned channel region where the gate is on three sides (and thus, there are three effective gates), one or more nanowires are used and the gate material generally surrounds each nanowire on all sides. Depending on the particular design, some nanowire transistors have, for example, four effective gates. The nanowire(s) may be formed while the channel region is exposed during a replacement gate process (e.g., an RMG process), after the dummy gate is removed, for example, or using some other suitable process. Note that the various GaN transistor structures described herein may be designed to be depletion mode (D-mode) or enhancement mode transistors, depending on the end use or target application. Further note that the processes 102-120 of method 100 are shown in a particular order in FIG. 1 for ease of description. However, one or more of the processes 102-120 may be performed in a different order or may not be performed at all. For example, boxes 106, 112, and 114 are optional process that may not be performed during method 100. Numerous variations and configurations will be apparent in light of the present disclosure.

Example System-On-Chip (SoC) Implementation

Figure 4:
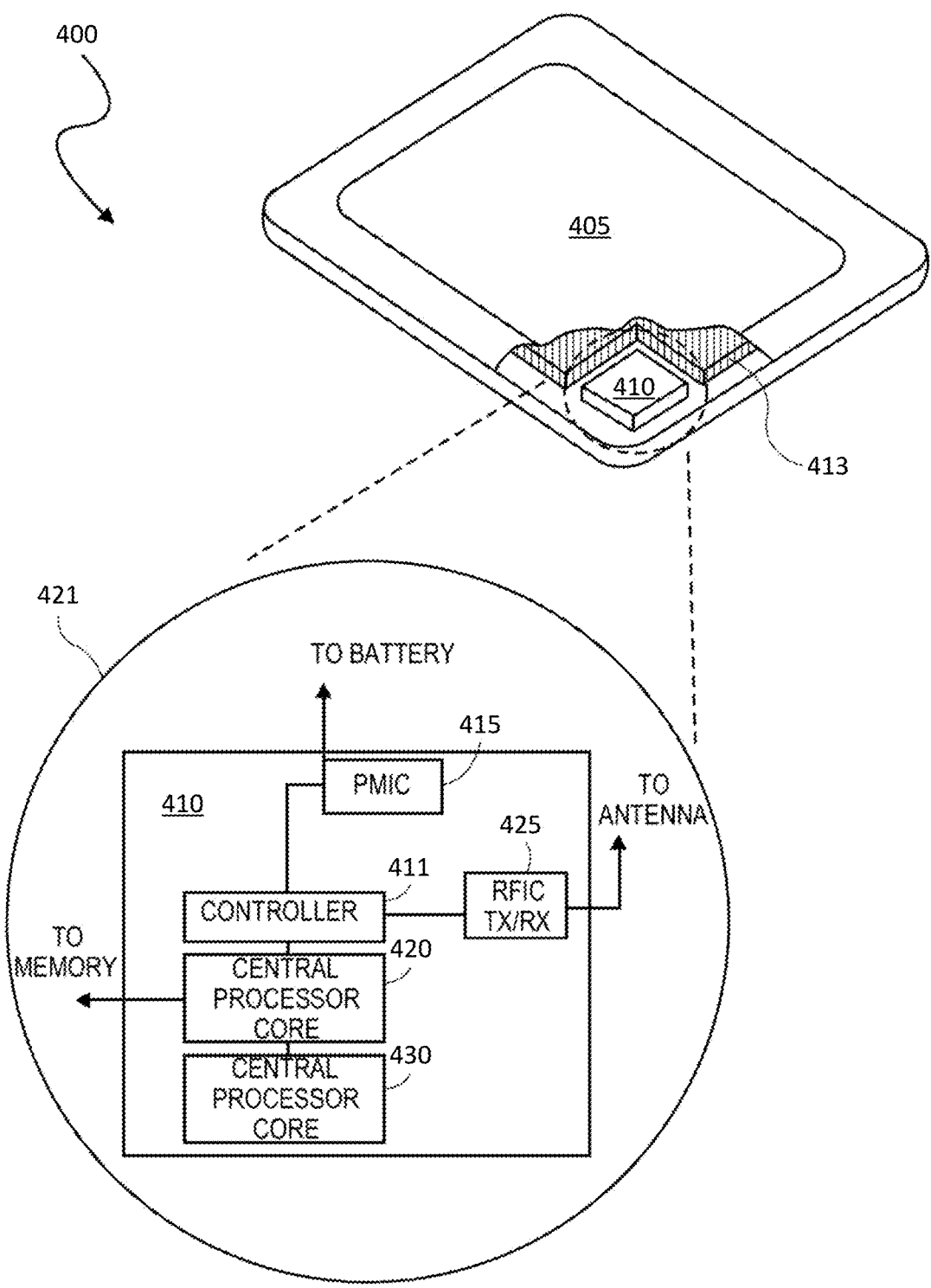
FIG. 4 illustrates a functional block diagram of a system-on-chip (SoC) implementation of a mobile computing platform, in accordance with various embodiments of the present disclosure.

FIG. 4 illustrates a functional block diagram of a SoC implementation of a mobile computing platform, in accordance with various embodiments of the present disclosure. The mobile computing platform 400 may be any portable device configured for each of electronic data display, electronic data processing, and wireless electronic data transmission. For example, mobile computing platform 400 may be any of a tablet, a smart phone, laptop computer, etc. and includes a display screen 405 that is in the exemplary embodiment a touchscreen (e.g., capacitive, inductive, resistive, etc.) permitting the receipt of user input, the SoC 410, and a battery 413. As illustrated, the greater the level of integration of the SoC 410, the more of the form factor within the mobile computing platform 400 that may be occupied by the battery 413 for longest operative lifetimes between charging, or occupied by memory (not depicted), such as a solid state drive, for greatest functionality.

Depending on its applications, mobile computing platform 400 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 410 is further illustrated in the expanded view 421. Depending on the embodiment, the SoC 410 may include a portion of a substrate (a chip) upon which two or more of the following are included: a power management integrated circuit (PMIC) 415; RF integrated circuit (RFIC) 425 including an RF transmitter and/or receiver; a controller thereof 411; and one or more central processor cores 420, 430. The RFIC 425 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 425 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 415 and RFIC 425. In embodiments of the present disclosure, the PMIC 415 and/or RFIC 425 employ one or more of the integrated circuit structures (e.g., including one or more GaN transistor structures) as variously described herein. In further embodiments the PMIC 415 and RFIC 425 employing the integrated circuit structures described herein may be integrated with one or more of the controller 411 and processor cores 420, 430 provided in, e.g., Si CMOS technology monolithically integrated with the PMIC 415 and/or RFIC 425 onto the substrate (e.g., substrate 200 as variously described herein). It will be appreciated that within the PMIC 415 and/or RFIC 425, the high-voltage GaN front-end RF switches and transistor structures described herein need not be utilized in exclusion to CMOS, but rather other CMOS devices and structures may be further included in each of the PMIC 415 and RFIC 425.

As further illustrated in the example embodiment of FIG. 4, the PMIC 415 has an output coupled to an antenna and may further have an input coupled to a communication module on the SoC 410, such as an RF analog and digital baseband module (not depicted). Alternatively, such communication modules may be provided on an IC off-chip from the SoC 410 and coupled into the SoC 410 for transmission. As can be understood based on the present disclosure, the isolated GaN transistor structures variously described herein can be used to provide high-voltage front-end RF switches including the low on-resistance and small form factor required for SoC. Further, oxide isolation techniques variously described herein allow the GaN transistors to be formed on Si, SiGe, and Ge substrates.

Example System

Figure 5:
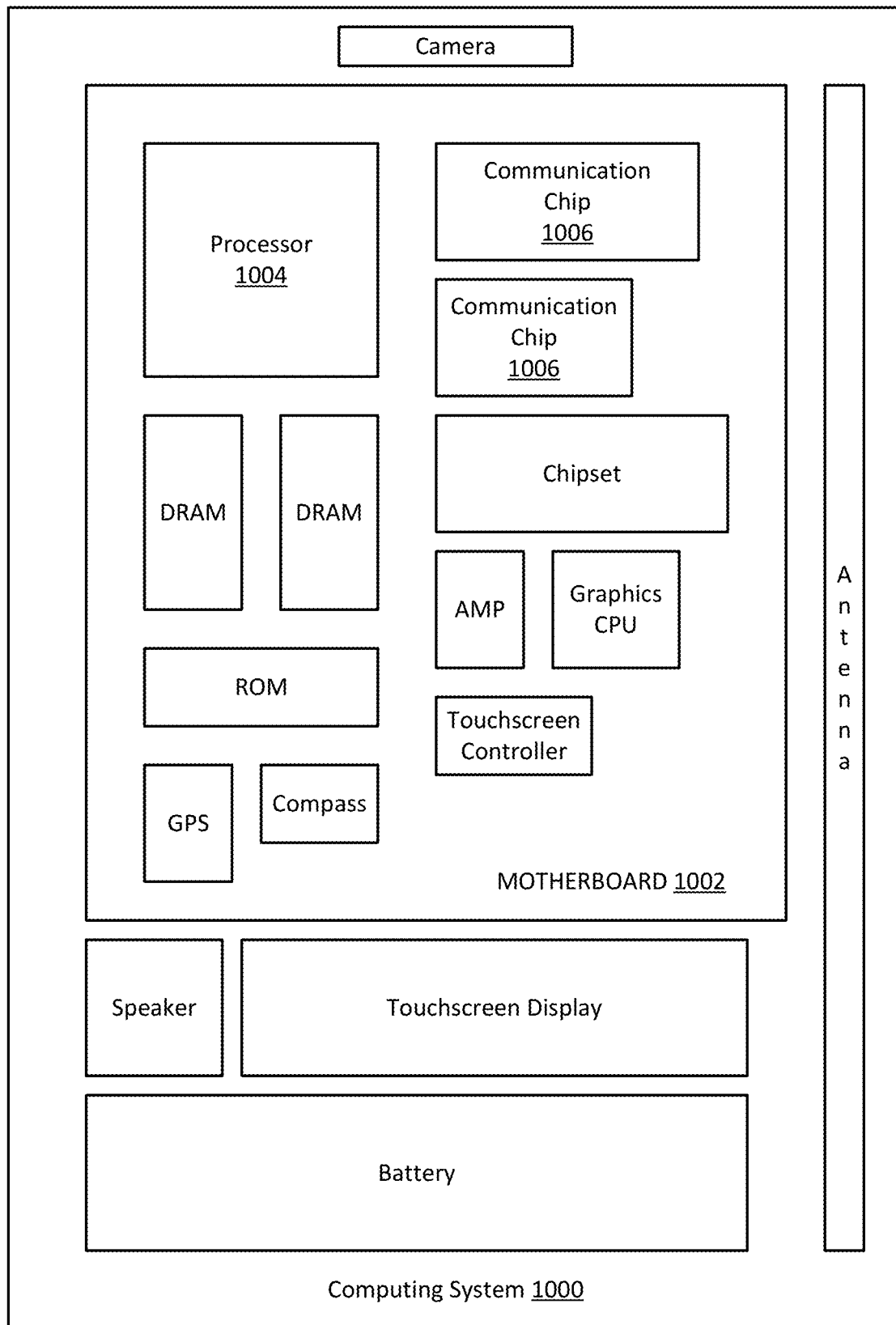
FIG. 5 illustrates a computing system implemented with integrated circuit structures or devices formed using the techniques disclosed herein, in accordance with various embodiments of the present disclosure.

FIG. 5 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate, a plurality of fins native to the substrate, wherein at least a portion of each fin is oxidized; a gallium nitride (GaN) layer on the fins and above the oxidized portion of the fins; and a transistor having a channel, the transistor channel included in the GaN layer.

Example 2 includes the subject matter of Example 1, wherein the substrate is one of a silicon, silicon germanium, and germanium bulk substrate.

Example 3 includes the subject matter of any of Examples 1-2, further including a nucleation layer at least partially between the fins and the GaN layer.

Example 4 includes the subject matter of Example 3, wherein the nucleation layer is one of gallium nitride deposited at a low temperature in the range of 700 to 950 degrees Celsius and aluminum nitride.

Example 5 includes the subject matter of any of Examples 1-4, further including at least one additional GaN layer above the GaN layer, the transistor channel including the at least one additional GaN layer.

Example 6 includes the subject matter of Example 5, further including a polarization layer above each additional GaN layer, wherein each polarization layer is one of aluminum nitride, aluminum gallium nitride, indium aluminum nitride, and indium aluminum gallium nitride.

Example 7 includes the subject matter of any of Examples 1-4, further including a graded layer above the GaN layer, the transistor channel including the graded layer.

Example 8 includes the subject matter of Example 7, wherein the graded layer includes GaN graded with indium.

Example 9 includes the subject matter of any of Examples 7-8, further including an aluminum nitride layer above the graded layer.

Example 10 includes the subject matter of any of Examples 1-9, wherein transistor source and drain regions comprise at least one of n-type doped indium gallium nitride, n-type doped gallium nitride, and n-type doped indium gallium nitride with a graded indium composition.

Example 11 includes the subject matter of any of Examples 1-10, wherein the transistor is an enhancement mode transistor.

Example 12 includes the subject matter of any of Examples 1-11, wherein the transistor is electrically isolated from the substrate.

Example 13 includes the subject matter of any of Examples 1-12, wherein the transistor includes at least one of the following geometries: a planar configuration, a non-planar configuration, a finned configuration, a tri-gate configuration, a nanowire configuration, a gate-all-around configuration, high-electron-mobility transistor (HEMT) architecture, pseudomorphic HEMT (pHEMT) architecture, two-dimensional electron gas (2DEG) architecture, three-dimensional electron gas (3DEG) architecture, three-dimensional polarization field-effect transistor (FET) architecture, multiple quantum-well (MQW) architecture, and super-lattice architecture.

Example 14 is a radio frequency (RF) switch including the subject matter of any of Examples 1-13, wherein the RF switch is a component of a system-on-chip (SoC) implementation.

Example 15 is a computing system including the subject matter of any of Examples 1-14.

Example 16 is a transistor including: a gallium nitride (GaN) pseudo-substrate on each of a plurality of fins native to a subjacent bulk silicon (Si) substrate, wherein the GaN pseudo-substrate is electrically isolated from the Si substrate; and a gate stack over a channel region, the channel region located in and/or on the GaN pseudo-substrate.

Example 17 includes the subject matter of Example 16, wherein at least a portion of the Si fins native to the substrate are oxidized to silicon dioxide, providing the electrical isolation from the Si substrate.

Example 18 includes the subject matter of any of Examples 16-17, further including a nucleation layer at least partially between the Si fins and the GaN layer.

Example 19 includes the subject matter of Example 18, wherein the nucleation layer is one of gallium nitride deposited at a low temperature in the range of 700 to 950 degrees Celsius and aluminum nitride.

Example 20 includes the subject matter of any of Examples 16-19, further including at least one additional GaN layer above the GaN layer, the transistor channel including the at least one additional GaN layer.

Example 21 includes the subject matter of Example 20, further including a polarization layer above each additional GaN layer, wherein each polarization layer is one of aluminum nitride, aluminum gallium nitride, indium aluminum nitride, and indium aluminum gallium nitride.

Example 22 includes the subject matter of any of Examples 16-19, further including a graded layer above the GaN layer, the transistor channel including the graded layer.

Example 23 includes the subject matter of Example 22, wherein the graded layer includes GaN graded with indium.

Example 24 includes the subject matter of any of Examples 22-23, further including an aluminum nitride layer above the graded layer.

Example 25 includes the subject matter of any of Examples 16-24, wherein transistor source and drain regions comprise at least one of n-type doped indium gallium nitride, n-type doped gallium nitride, and n-type doped indium gallium nitride with a graded indium composition.

Example 26 includes the subject matter of any of Examples 16-25, wherein the transistor is an enhancement mode transistor.

Example 27 includes the subject matter of any of Examples 16-26, wherein the GaN pseudo-substrate on each of a plurality of fins native comprises a plurality of GaN pseudo-substrate each corresponding to one of the fins.

Example 28 includes the subject matter of any of Examples 16-27, wherein the transistor includes at least one of the following geometries: a planar configuration, a non-planar configuration, a finned configuration, a tri-gate configuration, a nanowire configuration, a gate-all-around configuration, high-electron-mobility transistor (HEMT) architecture, pseudomorphic HEMT (pHEMT) architecture, two-dimensional electron gas (2DEG) architecture, three-dimensional electron gas (3DEG) architecture, three-dimensional polarization field-effect transistor (FET) architecture, multiple quantum-well (MQW) architecture, and super-lattice architecture.

Example 29 is a radio frequency (RF) switch including the subject matter of any of Examples 16-28, wherein the RF switch is a component of a system-on-chip (SoC) implementation.

Example 30 is a computing system including the transistor of any of Examples 16-29.

Example 31 is a method of forming an integrated circuit, the method including: forming a plurality of fins in a substrate; depositing a gallium nitride (GaN) layer on the fins; oxidizing at least a portion of each fin; and forming a transistor on and/or from the GaN layer.

Example 32 includes the subject matter of Example 31, further including depositing a polarization layer on the GaN layer, wherein the polarization layer is one of aluminum nitride, aluminum gallium nitride, indium aluminum nitride, and indium aluminum gallium nitride.

Example 33 includes the subject matter of any of Examples 31-32, further including depositing shallow trench isolation (STI) material between the fins prior to depositing the GaN layer on the fins.

Example 34 includes the subject matter of Example 33, further including recessing the STI material prior to depositing the GaN layer on the fins.

Example 35 includes the subject matter of any of Examples 33-34, further including recessing the STI material after depositing the GaN layer on the fins.

Example 36 includes the subject matter of any of Examples 31-35, further including depositing one or more additional III-N material layers above the GaN layer.

Example 37 includes the subject matter of any of Examples 31-36, further including underfilling a gap between the GaN layer and the substrate with STI material after oxidizing the at least a portion of each fin.

Example 38 includes the subject matter of any of Examples 31-37, wherein forming a transistor on and/or from the GaN layer includes patterning the GaN layer and any additional III-N layers above it into fins.

Example 39 includes the subject matter of any of Examples 31-38, wherein forming a transistor on and/or from the GaN layer includes depositing at least one of n-type doped indium gallium nitride, n-type doped gallium nitride, and n-type doped indium gallium nitride with a graded indium composition in source and drain regions of the transistor.

Example 40 includes the subject matter of any of Examples 31-39, wherein the transistor includes at least one of the following geometries: a planar configuration, a non-planar configuration, a finned configuration, a tri-gate configuration, a nanowire configuration, a gate-all-around configuration, high-electron-mobility transistor (HEMT) architecture, pseudomorphic HEMT (pHEMT) architecture, two-dimensional electron gas (2DEG) architecture, three-dimensional electron gas (3DEG) architecture, three-dimensional polarization field-effect transistor (FET) architecture, multiple quantum-well (MQW) architecture, and super-lattice architecture.

Example 41 includes the subject matter of any of Examples 31-40, wherein depositing a GaN layer on the fins includes selectively depositing the GaN layer on the fins so as to provide a plurality of GaN islands, each island corresponding to one of the fins.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a bulk substrate including semiconductor material;
   a plurality of fins native to the bulk substrate, wherein at least one of the fins includes an oxidized portion and an unoxidized portion above the oxidized portion;
   a structure including gallium and nitrogen, the structure directly on at least some of the fins and above the oxidized portion of the at least one fin; and
   a transistor having a gate stack on the structure, such that the gate stack overlaps the structure in a plan view.

2. The integrated circuit of claim 1, wherein the bulk substrate is one of a silicon bulk substrate, a silicon germanium bulk substrate, or a germanium bulk substrate.

3. The integrated circuit of claim 1, wherein the structure includes a first layer and a second layer, the first layer including gallium and nitrogen, and the second layer is at least partially between some of the fins and the first layer, wherein the second layer includes aluminum and nitrogen.

4. The integrated circuit of claim 1, wherein the structure includes a first layer and a second layer, the first layer including gallium and nitrogen, and the second layer at least partially between some of the fins and the first layer, wherein the second layer includes gallium and nitrogen.

5. The integrated circuit of claim 4, wherein the transistor includes the second layer.

6. The integrated circuit of claim 5, further comprising an aluminum-including layer above the second layer.

7. The integrated circuit of claim 1, wherein the structure includes a first layer and a second layer, the first layer including gallium and nitrogen, and the second layer is a graded layer above the first layer, the graded layer including a change in content of at least one material.

8. The integrated circuit of claim 7, wherein the graded layer includes gallium, nitrogen, and indium.

9. The integrated circuit of claim 7, further comprising an additional layer above the graded layer, the additional layer including aluminum and nitrogen.

10. The integrated circuit of claim 1, further comprising a source region and a drain region, the source and drain regions including gallium and nitrogen, the source and drain regions further including an n-type dopant.

11. The integrated circuit of claim 1, wherein the transistor is electrically isolated from the substrate by way of the oxidized portion of the at least one fin.

12. The integrated circuit of claim 1, wherein the transistor includes at least one of: a planar configuration, a non-planar configuration, a finned configuration, a tri-gate configuration, a nanowire configuration, a gate-all-around configuration, high-electron-mobility transistor (HEMT) architecture, pseudomorphic HEMT (pHEMT) architecture, two-dimensional electron gas (2DEG) architecture, three-dimensional electron gas (3DEG) architecture, three-dimensional polarization field-effect transistor (FET) architecture, multiple quantum-well (MQW) architecture, an enhancement mode configuration, or super-lattice architecture.

13. A system-on-chip including a radio frequency (RF) switch, the RF switch comprising the integrated circuit of claim 1.

14. A computing system comprising the integrated circuit of claim 1.

15. An integrated circuit comprising:
    a layer including gallium and nitrogen, the layer over one or more fins, each of the one or more fins native to a subjacent bulk silicon (Si) substrate and including an oxidized portion and an unoxidized portion above the oxidized portion, such that the layer is electrically isolated from the Si substrate by the corresponding oxidized portion; and
    a gate stack over a portion of the layer.

16. The integrated circuit of claim 15, further comprising an additional layer at least partially between at least one of the one or more fins and the layer, wherein the additional layer includes aluminum and nitrogen.

17. The integrated circuit of claim 15, wherein the layer and the gate stack are part of a transistor that includes at least one of: a planar configuration, a non-planar configuration, a finned configuration, a tri-gate configuration, a nanowire configuration, a gate-all-around configuration, high-electron-mobility transistor (HEMT) architecture, pseudomorphic HEMT (pHEMT) architecture, two-dimensional electron gas (2DEG) architecture, three-dimensional electron gas (3DEG) architecture, three-dimensional polarization field-effect transistor (FET) architecture, multiple quantum-well (MQW) architecture, an enhancement mode configuration, or super-lattice architecture.

18. The integrated circuit of claim 15, wherein the layer is over at least a portion of the sidewalls of the one or more fins and on a top surface of the one or more fins.

19. An integrated circuit including at least one transistor, the integrated circuit comprising:
  a bulk silicon substrate;
  first and second fins native to the substrate, wherein each of the first and second fins includes an oxidized portion and an unoxidized portion above the oxidized portion; and
  a layer including gallium and nitrogen, the layer over at least a portion of the sides of the first fin and over a top surface of the second fin, wherein the oxidized portion of each of the first and second fins is between the layer and the substrate.

* * * * *